(12) United States Patent
Lincer et al.

(10) Patent No.: US 9,195,576 B2
(45) Date of Patent: *Nov. 24, 2015

(54) SHARED MEMORY ARCHITECTURE

(71) Applicant: Lear Corporation, Southfield, MI (US)

(72) Inventors: Stanislav Lincer, Valls (ES); David Gamez Alari, Valls (ES); Jordi Moreno Aymami, Valls (ES); Antoni Ferre Fabregas, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/921,452

(22) Filed: Jun. 19, 2013

(65) Prior Publication Data
US 2013/0282990 A1 Oct. 24, 2013

Related U.S. Application Data

(63) Continuation of application No. 12/796,833, filed on Jun. 9, 2010, now Pat. No. 8,495,601.

(51) Int. Cl.
*G06F 9/46* (2006.01)
*G06F 9/44* (2006.01)
(Continued)

(52) U.S. Cl.
CPC . *G06F 12/00* (2013.01); *B60L 3/12* (2013.01); *B60L 11/1861* (2013.01); *H01M 10/48* (2013.01); *B60L 2240/545* (2013.01);
(Continued)

(58) Field of Classification Search
CPC ... G06F 9/44521; G06F 9/44516; G06F 8/36; G06F 12/00; G06F 9/526; G06F 9/542; G06F 9/465; G06F 9/54
See application file for complete search history.

(56) References Cited

U.S. PATENT DOCUMENTS

| 5,297,284 A | 3/1994 | Jones et al. |
| 5,634,058 A * | 5/1997 | Allen et al. ............... 717/163 |

(Continued)

FOREIGN PATENT DOCUMENTS

| CN | 1489120 A | 4/2004 |
| CN | 1504891 A | 6/2004 |

(Continued)

OTHER PUBLICATIONS

Tota et al., MEDEA: a hybrid shared-memory/message-passing multiprocessor NoC-based architecture, Mar. 2010, 6 pages.*

(Continued)

*Primary Examiner* — Thuy Dao
(74) *Attorney, Agent, or Firm* — Brooks Kushman P.C.

(57) ABSTRACT

A memory architecture includes a non-volatile, application memory block having first application code for application functions capable of being called by first application, a non-volatile launcher memory block having second application code for application functions capable of being called by a second application, a non-volatile, shared memory block having shared code for shared functions, and a fixed memory locations dedicated within the shared memory block to store shared function pointers, and a volatile memory storing callback pointers. The second application code is launcher code that is operable to initialize the first application code. At least one volatile memory storing callback pointer is associated with each one of the shared functions. The callback pointers point to callback function code when the first application is executing and to callback function code when the second application is executing.

11 Claims, 4 Drawing Sheets

(51) Int. Cl.
*G06F 12/00* (2006.01)
*B60L 3/12* (2006.01)
*B60L 11/18* (2006.01)
*H01M 10/48* (2006.01)
*G01R 31/36* (2006.01)

(52) U.S. Cl.
CPC ....... *B60L2240/549* (2013.01); *G01R 31/3606* (2013.01); *Y02T 10/705* (2013.01); *Y02T 10/7005* (2013.01); *Y02T 10/7044* (2013.01)

(56) References Cited

U.S. PATENT DOCUMENTS

| | | | | |
|---|---|---|---|---|
| 6,023,704 | A * | 2/2000 | Gerard et al. | 1/1 |
| 6,407,949 | B1 | 6/2002 | Jha et al. | |
| 6,826,763 | B1 * | 11/2004 | Forin et al. | 719/330 |
| 7,007,202 | B2 | 2/2006 | Kuroiwa et al. | |
| 7,093,244 | B2 | 8/2006 | Lajoie et al. | |
| 7,185,191 | B2 | 2/2007 | Bosley et al. | |
| 7,353,521 | B1 * | 4/2008 | Jin | 719/330 |
| 7,493,460 | B2 | 2/2009 | Zimmer et al. | |
| 7,496,906 | B2 | 2/2009 | Black-Ziegelbein et al. | |
| 7,747,980 | B2 | 6/2010 | Illowsky et al. | |
| 7,769,505 | B2 | 8/2010 | Rask et al. | |
| 7,954,094 | B2 | 5/2011 | Cascaval et al. | |
| 8,140,204 | B2 | 3/2012 | Okubo et al. | |
| 8,146,066 | B2 | 3/2012 | Demetriou et al. | |
| 8,190,320 | B2 | 5/2012 | Kelty et al. | |
| 8,305,034 | B2 | 11/2012 | Rubio | |
| 8,321,850 | B2 | 11/2012 | Bruening et al. | |
| 8,689,234 | B2 * | 4/2014 | Macken | 719/313 |
| 8,732,674 | B1 * | 5/2014 | Agha | 717/130 |
| 8,869,166 | B2 * | 10/2014 | McKenney | 718/107 |
| 2002/0013822 | A1 | 1/2002 | West | |
| 2002/0069399 | A1 * | 6/2002 | Miloushey et al. | 717/108 |
| 2002/0144006 | A1 | 10/2002 | Cranston et al. | |
| 2003/0014555 | A1 * | 1/2003 | Cierniak | 709/315 |
| 2004/0034861 | A1 | 2/2004 | Ballai | |
| 2004/0111720 | A1 | 6/2004 | Vertes | |
| 2005/0240755 | A1 | 10/2005 | Stein et al. | |
| 2005/0251673 | A1 | 11/2005 | Bosley et al. | |
| 2005/0283585 | A1 | 12/2005 | Sexton et al. | |
| 2005/0289510 | A1 | 12/2005 | Illowsky et al. | |
| 2005/0289527 | A1 | 12/2005 | Illowsky et al. | |
| 2006/0200331 | A1 * | 9/2006 | Bordes | 703/13 |
| 2006/0242635 | A1 | 10/2006 | Broussard et al. | |
| 2007/0083565 | A1 | 4/2007 | McKenney | |
| 2007/0083813 | A1 | 4/2007 | Lui et al. | |
| 2008/0098374 | A1 | 4/2008 | Adl-tabatabai et al. | |
| 2008/0184212 | A1 | 7/2008 | Lee et al. | |
| 2008/0276036 | A1 * | 11/2008 | Van Acht et al. | 711/103 |
| 2009/0024266 | A1 | 1/2009 | Bertness et al. | |
| 2009/0140698 | A1 | 6/2009 | Eberhard et al. | |
| 2010/0019733 | A1 | 1/2010 | Rubio | |
| 2010/0033571 | A1 | 2/2010 | Fujita et al. | |
| 2011/0055434 | A1 * | 3/2011 | Pyers et al. | 710/14 |
| 2011/0126213 | A1 * | 5/2011 | Macken | 719/313 |
| 2011/0131559 | A1 | 6/2011 | Young et al. | |
| 2012/0185679 | A1 * | 7/2012 | Archer et al. | 712/225 |
| 2012/0253569 | A1 | 10/2012 | Novak et al. | |

FOREIGN PATENT DOCUMENTS

| | | |
|---|---|---|
| DE | 102007044405 | 3/2009 |
| DE | 102009034409 | 2/2010 |
| JP | 10320203 A | 12/1998 |
| JP | 2001116527 A | 4/2001 |
| WO | 02084484 | 10/2002 |

OTHER PUBLICATIONS

Peytchev et al., Optimizing the architecture of distributed shared memory systems in real time applicatons, Jul. 2007, 5 pages.*

Park et al., Power management of hybrid DRAM/PRAM-based main memory, Jun. 2011, 6 pages.

Lee et al., A fuel-cell-battery hybrid for portable embedded systems, Jan. 2008, 34 pages, <http://delivery.acm.org/10.1145/1300000/1297685/a19-lee.pdf.

Zhou et al., Maximizing the lifetime of embedded systems powered by fuel cell-battery hybrids, Oct. 2006, 6 pages, <http://delivery.acm.org/10.1145/1170000/1165676/p424-zhou.pdf.

Mangalagiri et al., A low-power phase change memory based hybrid cache architecture, May 2008, 4 pages, <http://delivery.acm.org/10.1145/1370000/1366204/p395-mangalagiri.pdf.

Office Action for U.S. Appl. No. 12/796,774 dated Oct. 1, 2012.

Office Action for U.S. Appl. No. 12/796,833 dated Aug. 23, 2012.

Notice of Allowance for U.S. Appl. 12/796,833 dated Jan. 14, 2013.

Chinese Office Action dated Aug. 29, 2015 in Chinese Appn. No. 2014102522716 filed Jun. 9, 2014, 6 pgs.

* cited by examiner

SHARED MEMORY ARCHITECTURE

CROSS-REFERENCE TO RELATED APPLICATIONS

This application is a continuation of U.S. application Ser. No. 12/796,833 filed Jun. 9, 2010, now U.S. Pat. No. 8,495,601 issued Jul. 23, 2013, which relates to concurrently filed and commonly owned U.S. application Ser. No. 12/796,774, entitled Method and System of Updating Shared Memory, filed Jun. 9, 2010, now U.S. Pat. No. 8,539,472 issued Sept. 17, 2013, the disclosure of which is incorporated in its entirety by reference herein.

TECHNICAL FIELD

The presenting invention relates to a shared memory architecture where code or other data sufficient to support shared functionality is stored to a shared memory block.

BACKGROUND

Software code, such as the type used to support functions performed by a central processing unit (CPU), is typically written to perform specific operations. The code associated with one piece of software may not be usable with code written for another piece of software. When a memory is tasked with storing code for multiple pieces of software, the code for each piece of software must be fully stored to the memory. In the event two or more pieces of the software facilitate execution of the same or similar functions, memory space is allocated to store the corresponding code for each of the two or more piece of software. This creates redundancy in so far as duplicate code is stored for the same or similar functions.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

Figure 1:
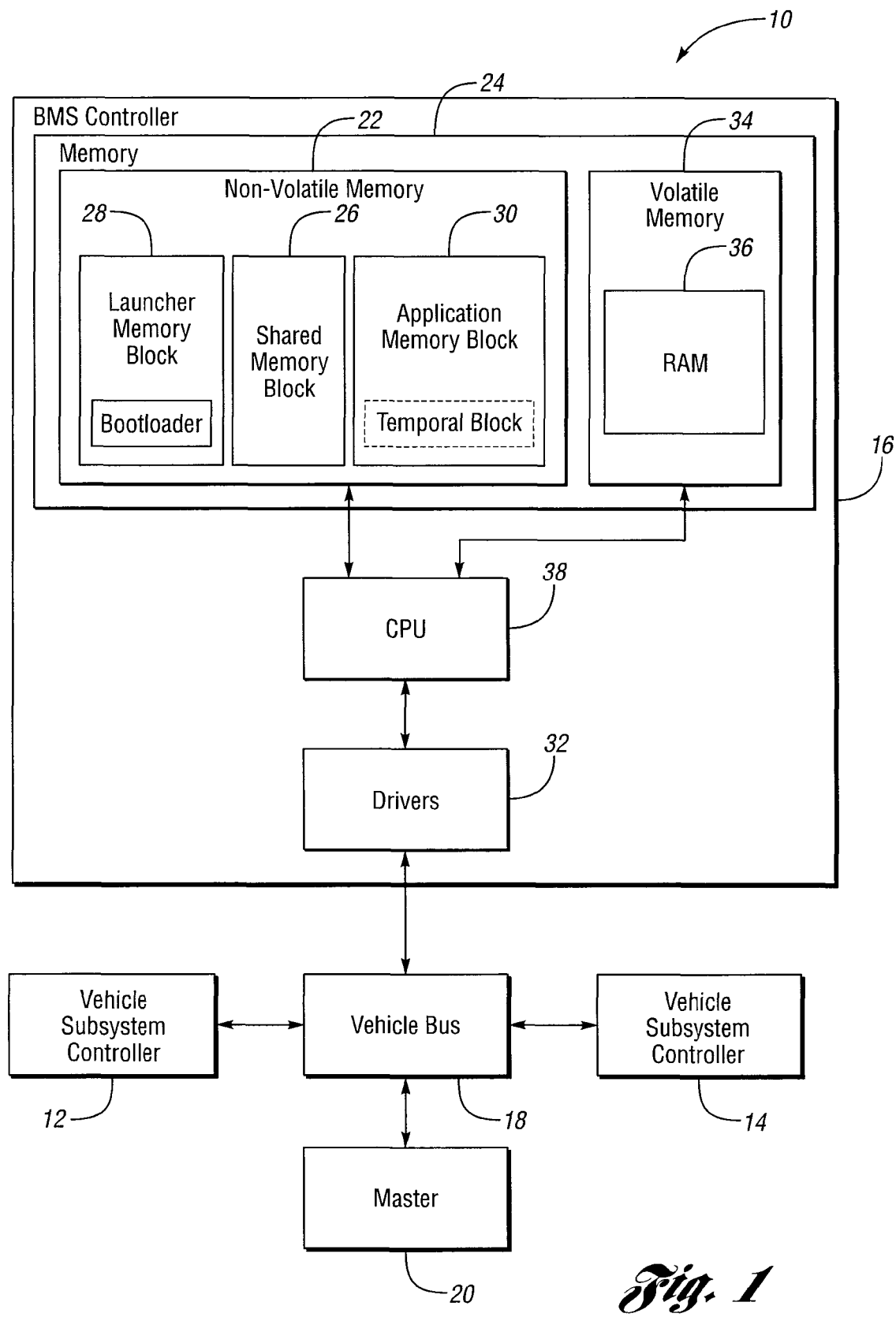
FIG. 1 illustrates a vehicle control system in accordance with one non-limiting aspect of the present invention.

FIG. 1 illustrates a vehicle control system 10 in accordance with one non-limiting aspect of the present invention. The vehicle control system 10 may be included within a vehicle (not shown) having a number of vehicle subsystems (not shown) controlled by one or more vehicle subsystem controllers 12, 14, 16, such as but not limited to vehicle infortainment, security (passive entry, remote keyless entry, etc.), illumination, heating and air conditioning, and engine control subsystems. The operation, update, interaction, and control of the vehicle subsystems may be directed with communications carried over a vehicle bus 18 according to instructions issued by a master controller 20. While this vehicle system 10 is presented, it is presented only for exemplary purposes and to demonstrate one of many environments where the present invention may be applicable. The present invention fully contemplates its application to other non-vehicle environments.

The illustrated vehicle-based environment represents one environment where it may be necessary to periodically update a non-volatile memory 22 of a memory 24 having a shared memory block 26. The vehicle environment also represents one environment where controllers 12, 14, 16 may be required to operate and/or communicate with other controllers 12, 14, 16 over communication bus 18 and/or wirelessly. In the exemplary illustration, the controller 16 is labeled as a battery monitoring system (BMS) controller 16. The BMS controller 16 is configured to operate in cooperation with hardware of a BMS (not shown) that is operable, for example, to measure current flow, battery temperature, and to perform any number of other operations relate to a vehicle battery. The U.S. patent application Ser. No. 12/486,847, entitled Battery Monitoring System, the disclosure of which is hereby incorporated in its entirety by reference, describes one such BMS.

In addition to the shared memory block 26, the memory 24 of the BMS controller 16 is shown to include a launcher memory block 28 and an application memory block 30. The application memory block 30 stores code associated with an application. The application may be operational to perform various functions associated with the BMS, such as to facilitate measure and reporting current flow to one or more of the other controllers (the master is also considered to be a controller). The launcher memory block 28 stores code associated with a launcher. The launcher may be configured to facilitate start-up and/or initialization of the BMS, such as but not limited to loading drivers 32 and/or otherwise facilitating operations needed in order for the application to execute its desired operations.

The BMS controller 16 may include a volatile memory block 34 having a random accessory memory RAM 36 block. The volatile memory 34, unlike the non-volatile memory 22, erases any stored code each time the BMS controller 16 is reset or power is lost. The volatile memory 34, as described below, may be loaded with software code particular to supporting functions associated with the launcher and the application. Optionally, different sets of code may be written to the RAM 36 depending on whether the launcher or application is currently executing. One non-limiting aspect of the present invention contemplates an arrangement where only code from one of the launcher or application is written to the RAM 36, or at least to particular locations of the RAM 36 dedicated to support the shared functionality contemplated by the present invention, which is described in more detail below.

The BMS controller 16 is shown to include a central processing unit (CPU) 38. The CPU 38 may be configured to execute operations according to instructions read from the memory 22, e.g., to facilitate operations associated with the launcher and application. The CPU 38 may also be configured to facilitate writing code to the memory 22, such as to support some of the operations described below in more detail. The CPU 38 is shown to interact with the drivers 32 used to interact with the hardware components of the BMS, including hardware components required to support communications with the other controllers 12, 14 over the vehicle bus 18.

The communications carried out between the BMS controller 16 and one or more of the other controllers 12, 14 may be directed and/or executed according to communication code stored in the shared memory block 26. The communication code may be stored in the shared memory block 26 and used by both of the launcher and application when executing communication related operations (optionally, the shared memory 26 may be used by other applications and/or features operating on the BMS controller 16). The use of the shared memory 26 may be beneficial if the volume of communication code needed to support communications is rather larger. The ability to share the communication code, as opposed to storing separate sets of communication code for each of the launcher and application, may reduce the overall volume of communication code needed to support the launcher, application and other communication depending elements, if any.

Figure 2:
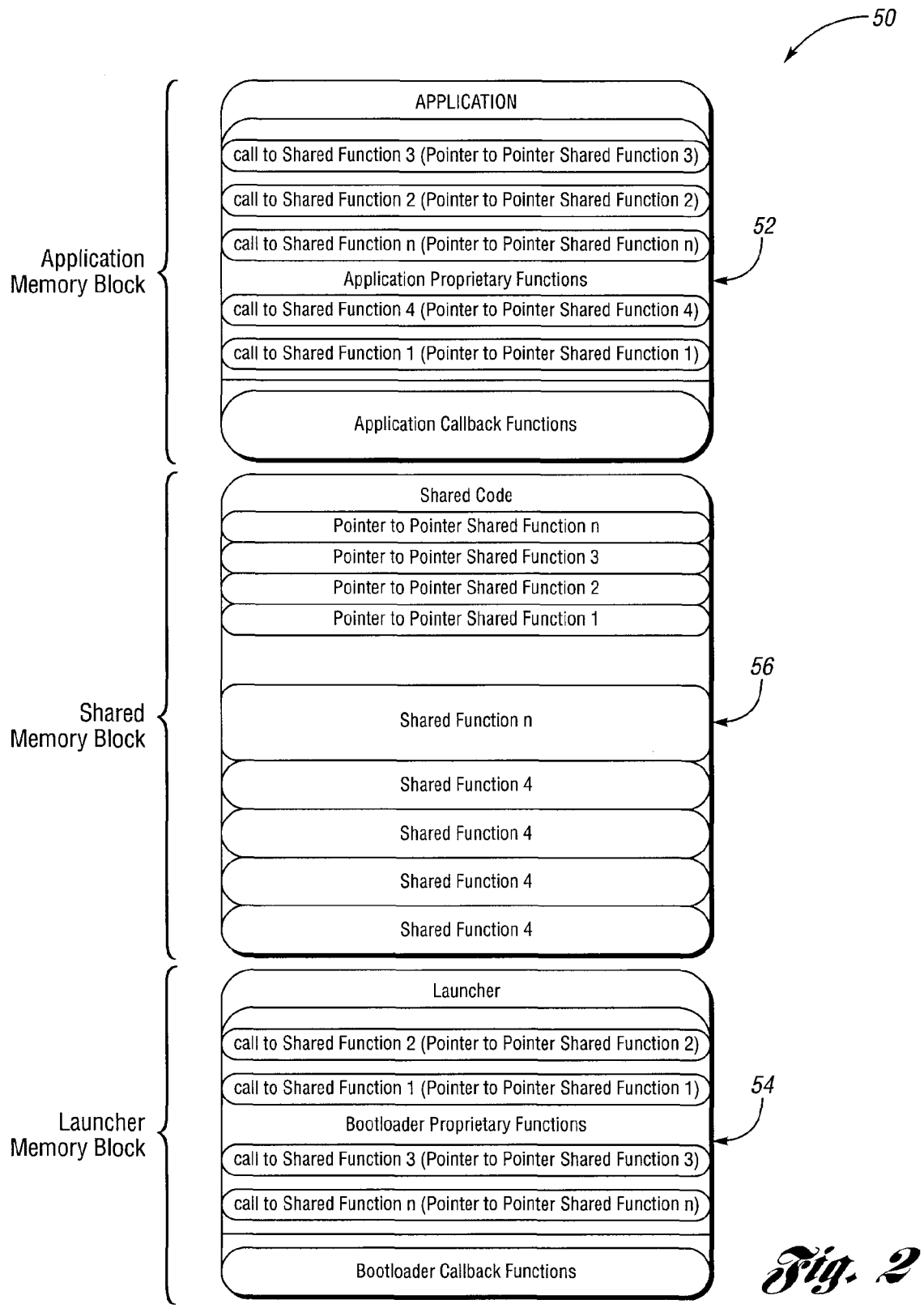
FIG. 2 illustrates a memory map of a non-volatile memory in accordance with one non-limiting aspect of the present invention.

FIG. 2 illustrates a memory map 50 of the non-volatile memory 22 in accordance with one non-limiting aspect of the present invention. The memory map 50 indicates the structure of data within the non-volatile memory 22 according to the function or operation to be executed according to the data read from the corresponding memory location. The particular pieces of data, also referred to herein interchangeably as code, required to execute the indicated functions/operations need not be clustered or arranged in the illustrated patterns. As one skilled in the art will appreciate, a compiler associated with each section of memory 24 may scatter or otherwise organize the data in other patterns. The compiler, in that case, would keep track of each memory location required to read in order to perform each of the indicated functions.

The non-volatile memory map 50 illustrates the non-volatile memory 22 having at least three maps, one for each of the application memory block 30, shared function memory block 26, and launcher memory block 28.

An application memory map 52 illustrates a number of functions executable by reading code stored therein, which for exemplary purposes are labeled as calls to shared functions 1, 2, 3, 4, n that result in a call to a corresponding one of the shared functions of the shared memory block 26; application proprietary functions that relate to various functions performed by the application, such as but not limited to those associated with determining current flow, temperature, and other information associated with operation of the BMS 16; and application callback functions that are to be executed in case of error or in the case other actions to be execute as a result of at least one of the shared functions.

A launcher memory map 54 illustrates a number of functions executable by reading code stored therein, which for exemplary purposes are labeled as calls to shared functions 1, 2, 3, 4, n that result in a call to a corresponding one of the shared functions of the shared memory block 26; launcher proprietary functions that relate to various functions performed by the launcher, such as but not limited to those associated with loading drivers and enabling ports; and application callback functions that are to be executed in case of error or in the case other actions to be execute as a result of at least one of the shared functions.

A shared function memory map 56 illustrates a number of functions executable by reading code stored therein, which for exemplary purposes are labeled as shared functions 1, 2, 3, 4, n, such as a transmit data function that can be used by either one of the application and launcher to transmit data over the vehicle bus; and pointers to the shared functions 1, 2, 3, 4, n. Any number of n number of shared functions may be facilitate with code stored to the shared memory block 26. The shared function labels uniquely identify the shared function associated therewith. Numerical values are shown as the unique labels for exemplary purposes as any label could be used. The pointers direct calls received from the launcher and the application to a location of the share memory block 26 corresponding with the requested shared function.

The locations of the shared memory block 26 dedicated to the shared function pointers remains fixed, both in size and/or location, as long as code to the n number of shared functions is stored to the shared memory block. In this manner, the code stored in the shared memory block 26 may be updated or otherwise manipulated with a compiler without effecting the storage location and designation of the shared function pointers. The location to which the shared functions pointer point, however, may be updated with compiling, such as if the location of the pointer to shared function code should change, which may occur if the size of one or more of the shared functions changes after compiling.

By fixing the location of each of the shared function pointers and the shared function to which each pointer points, the present invention is able to provide a known location for the calls received from the launcher and application. The launcher and application need only program each of the shared function calls to point to the corresponding pointer of the matching shared function, i.e., the launcher and application need not know or keep track of the corresponding location of the shared function since the pointers to each of the shared functions are known and remains fixed.

One non-limiting aspect of the present invention contemplates arranging the storage of each of the shared function pointers according to the unique label association therewith such that the code associated with the shared function pointer 1 is arranged in front of the code associated with shared function pointer 2 and the code associated with the shared function pointer 2 is arranged in from of the code associated with the shared function pointer 3, etc. This type of arrangement may correspond with arranging a physical storage location of the corresponding pointer code and/or the address at which the code is understood to be located, i.e., pointer code could be stored at any locations as long as the same address always point to the location of the pointer code. In the event shared functions are added, additional pointers may be added to physical locations following the other pointers and/or to addresses following the other pointers (e.g., the new address may increment one from the last addresses of the other pointers).

Figure 3:
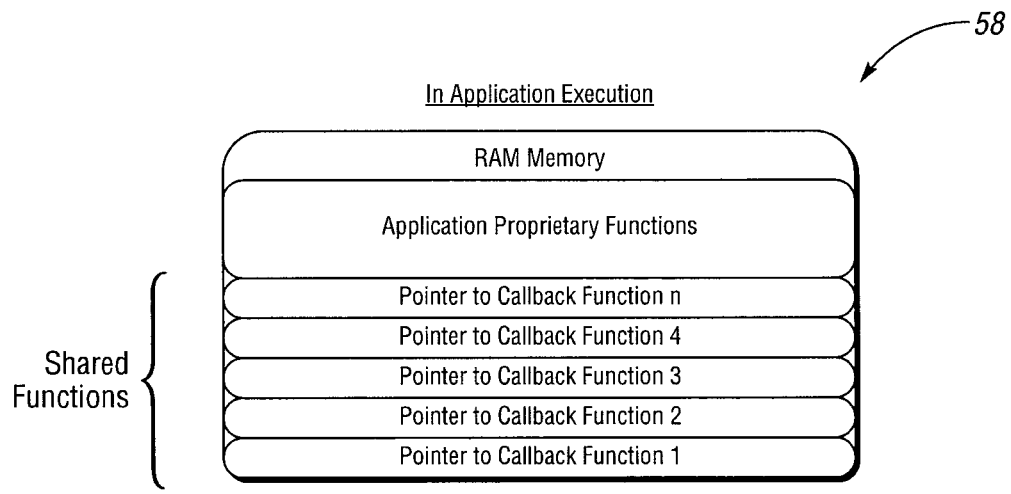
FIGS. 3-4 illustrate a memory map of a volatile memory in accordance with one non-limiting aspect of the present invention.
Figure 4:
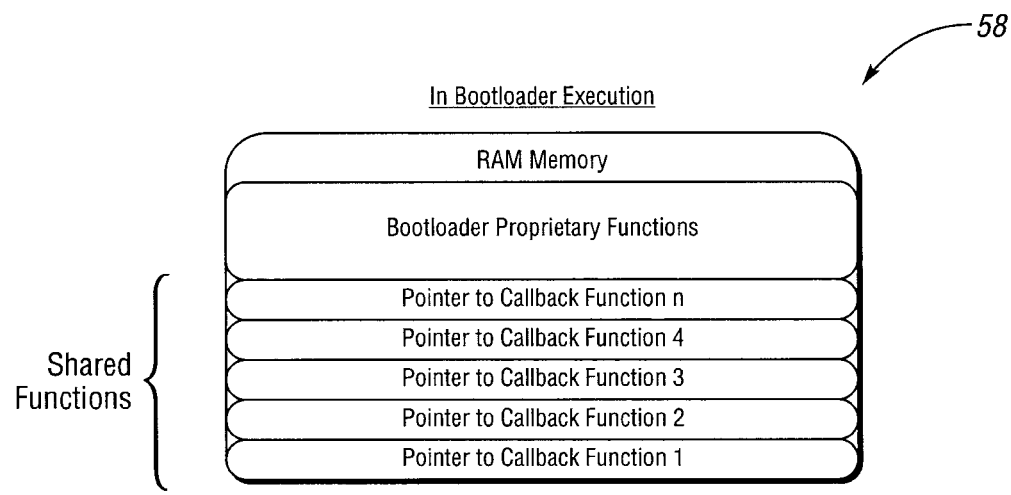

FIGS. 3-4 illustrate a memory map 58 of the volatile memory 54 in accordance with one non-limiting aspect of the present invention. The memory map 58 indicates the structure of data within the volatile memory 34 according to the function or operation to be executed according to the data read from the corresponding memory location. FIG. 3 illustrates the memory map 58 associated with the RAM 36 when the application is executing and FIG. 4 illustrates the memory map 58 associated with the RAM 36 when the launcher is executing, or in particular, when a bootloader application included as a part of the launcher is executing.

The function provided by the code in the RAM 36 is identified by the unique label associated therewith. Depending on whether the application or bootloader is operational, a portion of the RAM 36 will store code associated with application or bootloader propriety functions, such as those required to support the operation of the application and bootloader, such as to store code capable of performing measurements and other operations at speeds greater than that could be performed by similar code stored in the non-volatile memory and communication functions which are not required to be shared. Other portions of the RAM 36 will store pointers to callback functions for each of the shared functions, i.e., shared functions 1, 2, 3, 4, through n. The callback function pointers may be identified as bootloader callback function pointers or application callback function pointers and used to point to specific callback functions within the memory maps 52, 54 of the application and bootloader that are to be performed in the case of error or other desired action to result from the execution of the correspondingly labeled shared function.

Like the pointers stored within the shared memory block 28, the pointers stored in the volatile memory block 34 may be stored in a fixed location assigned to each of the n number of shared functions. The shared functions are each configured to point to the same location within the RAM 36, i.e., the location that corresponds with the identity of the shared function causing the callback. There is no need to identify the operating one or the bootloader and application within the shared function code since the location of the pointers in the RAM 36 are fixed and different pointers are stored into those fixed locations depending on whether the application or bootloader are operational.

Figure 5:
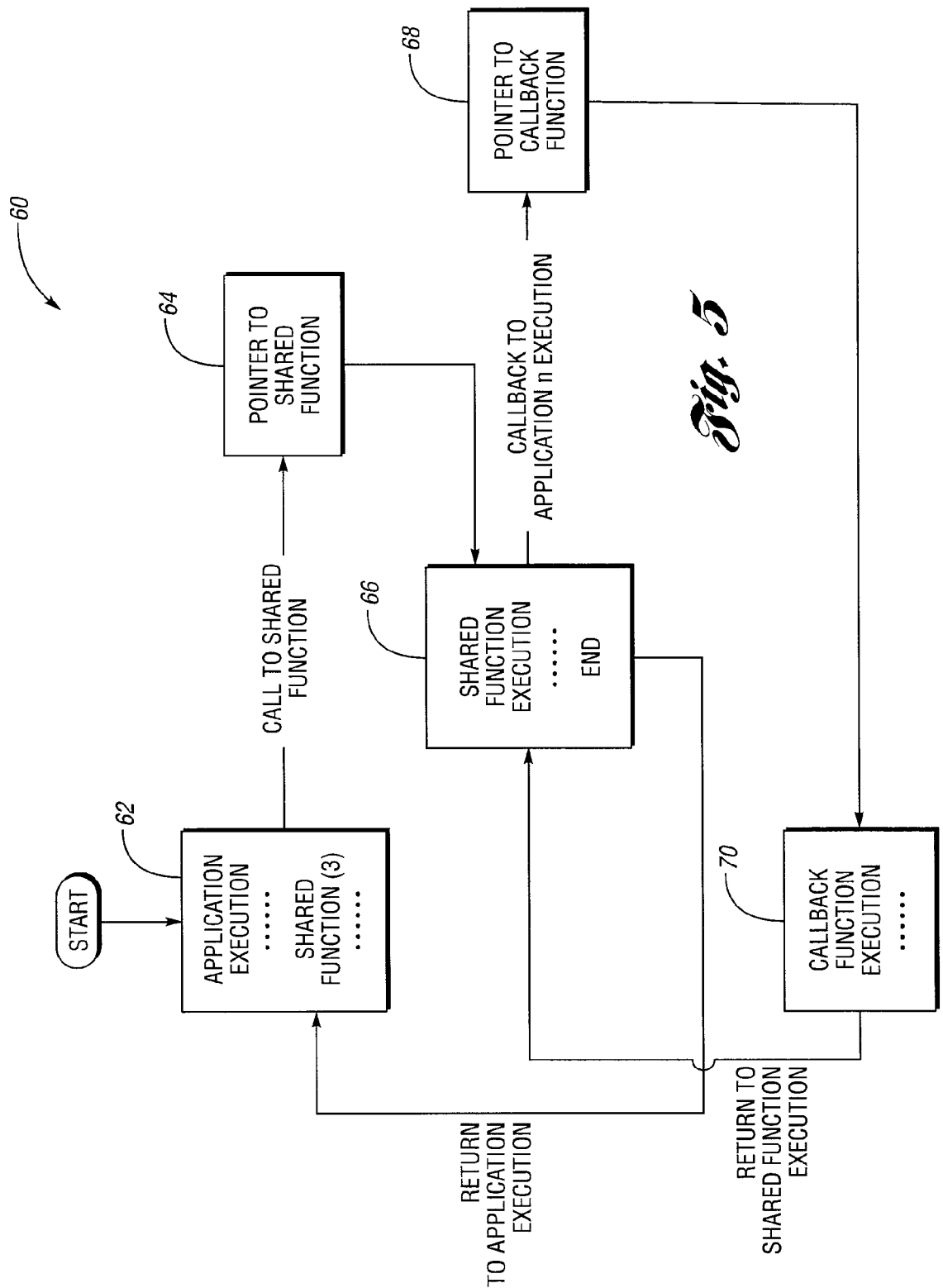
FIG. 5 illustrates a flowchart for execution of a shared function in accordance with one non-limiting aspect of the present invention.

FIG. 5 illustrates a flowchart for execution of a shared function in accordance with one non-limiting aspect of the present invention. The application is shown to be originating a call of the shared function for exemplary purposes and without intending to limit the scope and contemplated of the present invention. One non-limiting aspect of the present invention contemplates originating the call from either one or the launcher and application so as to allow the same code to be used by multiple pieces of software, i.e., the launcher and the application. The execution of the shared function, regardless of whether the shared function was called by the application, the launcher, or some other piece of software, would execute in a manner similar to that shown in FIG. 5.

For exemplary purposes, the called shared function is predominately described with respect to be a transmit data function. The transmit data function may relate to the application requesting permission from the master 20 to transit data over the vehicle bus 18, such as to transmit data associated with a current measurement value or other information calculated by the BMS 16 to one or more of the vehicle subsystems 12, 14. In the event another relationship exist between the BMS 16 and the master 20, such as if the master is a client and the BMS 16 is a server, another exchange may take between the master 20 and BMS 16 before the transmit data function is executed, including the BMS 16 having the capability to transmit data at its own initiative. The called shared function is described with respect to being a communication related function as one non-limiting aspect of the present invention contemplates reducing memory space associated with communication related functions by allowing two or more pieces of software to share at least some of the same code to facilitate communication related functions.

Block 62 relates to the CPU 38 executing a call to execute the transmit data function (shared function) according to code read from the application memory block 30. The call is executed by the CPU 38 reading the portion of the application memory block 30 identified within the application memory map 52 to correspond with the desired shared function, which for exemplary purposes is selected to correspond with shared function 3. Block 64 relates to CPU 38 reading a pointer stored as part of the called shared function that points to the pointer of the called shared function stored within the shared memory block 26. Each shared function call for each of the application and launcher includes a pointer to the related pointer stored within the shared memory block 26. Because the pointers stored within the shared memory block 26 are fixed, the pointers of each of the calls to the shared function similarly pointer to the same fixed location.

Block 66 relates to the CPU 38 executing the shared function according to code read from the shared memory block 26. In the event the shared function executes without requiring a callback, i.e., the called shared function completes and/or no other callback results from completion of the function, the shared function is considered executed and a return is made to Block 62. In the event a callback occurs, i.e., the called shared function fails to completely execute or the complete execution of the called shared function produces an event requiring callback; the CPU 38 recovers the callback pointer assigned to the corresponding shared function from the RAM 36 in Block 68.

The shared function code stored in the shared memory map 56 includes a pointer that points to a location with the RAM 36 assigned to pointer to the callback function to be executed by the CPU 38 in case of callback (one or more of the shared functions may include pointer to one or more of the same or different RAM 36 locations). Since the callback pointers stored in RAM 36 are loaded depending on whether the application or launcher is executing, the code of the shared functions stored in the shared function memory block 26 need not identify the callback function to be associated with one of the launcher or the application. In Block 70, the CPU 38 then executes the callback function pointed to by the callback pointer stored in the RAM 36 according to code correspondingly stored in application memory block 30 for the corresponding callback function, or in the event the launcher was executing, from the callback code stored in the launcher memory block 28. Optionally, once the callback function is completed, processing may return to that dedicated by the shared function originating the callback function.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention. The features of various implementing embodiments may be combined to form further embodiments of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A memory architecture comprising:
   a non-volatile, application memory block having first application code for application functions capable of being called by a first application;
   a non-volatile, launcher memory block having second application code for application functions capable of being called by a second application, the second application code being launcher code that is operable to initialize the first application code;
   a non-volatile, shared memory block having shared code for shared functions; and
   fixed memory locations dedicated within the shared memory block to store shared function pointers; and
   volatile memory storing callback pointers, at least one associated with each one of the shared functions, wherein the callback pointers point to callback function code stored within the non-volatile, application memory block having first application code when the first application is executing and to callback function code stored within the non-volatile, launcher memory block having second application code when the second application is executing.

2. The memory architecture of claim 1 wherein volatile memory does not simultaneously store pointers to callback function code stored within the non-volatile, application memory block having first application code and the non-volatile, launcher memory block having second application code.

3. The memory architecture of claim 1 wherein callback pointers are stored in fixed locations of the volatile memory such the callback pointers for each of the shared functions are stored at the same location for each of the first and second applications.

4. The memory architecture of claim 3 wherein the code stored in the shared memory block for each of the shared functions includes a pointer to the fixed location of the one of the callback pointers associated with each shared function.

5. The memory architecture of claim 1 wherein fixed memory locations store the same one of the shared function pointers following each compiling of the shared code where at least the same shared functions are still available.

6. The memory architecture of claim 1 wherein an amount of memory required to store the shared code for at least one of the shared functions increases in size following compiling and wherein each of the shared function pointers remain in the same one of the locations after the compiling.

7. A battery monitoring system (BMS) controller comprising:

a non-volatile, application memory block having application code for an application operable to execute battery monitoring related functions;
a non-volatile, launcher memory block having launcher code for a launcher operable for initializing the BMS;
a non-volatile, shared memory block having shared code for shared functions;
fixed memory locations dedicated within the shared memory block to store shared function pointers; and
a volatile memory storing callback pointers, wherein the callback pointers point to code stored in the application memory block in the event the application is operating and to code stored in the launcher memory block in the event the launcher is operating.

8. The BMS controller of claim 7 wherein callback pointers are stored in fixed locations of the volatile memory such that the callback pointers are stored at the same location while each of the launcher and applications are operating.

9. The BMS controller of claim 7 wherein the fixed memory locations store the same one of the shared function pointers following each compiling of the shared code where at least the same shared functions are still available.

10. The BMS controller of claim 9 wherein an amount of memory required to store the shared code for at least one of the shared functions increases in size following compiling and wherein each of the shared function pointers remain in the same one of the locations after the compiling.

11. The BMS controller of claim 7 wherein each of the launcher memory block and application memory block store pointers, one associated with each one of the of fixed location of the shared memory block.

* * * * *

UNITED STATES PATENT AND TRADEMARK OFFICE
CERTIFICATE OF CORRECTION

PATENT NO. : 9,195,576 B2
APPLICATION NO. : 13/921452
DATED : November 24, 2015
INVENTOR(S) : Stanislav Lincer et al.

Page 1 of 1

It is certified that error appears in the above-identified patent and that said Letters Patent is hereby corrected as shown below:

In the Claims

Column 7, Line 13, Claim 3:

After "such", insert -- that --.

Signed and Sealed this
Twelfth Day of July, 2016

Michelle K. Lee
*Director of the United States Patent and Trademark Office*